United States Patent
Ku et al.

(10) Patent No.: US 6,646,339 B1
(45) Date of Patent: Nov. 11, 2003

(54) THIN AND HEAT RADIANT SEMICONDUCTOR PACKAGE AND METHOD FOR MANUFACTURING

(75) Inventors: Jae Hun Ku, Seoul (KR); Jae Hak Yee, S.K. Mansion (SG)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/687,787

(22) Filed: Oct. 13, 2000

(30) Foreign Application Priority Data

Oct. 15, 1999 (KR) .......................................... 1999-44655

(51) Int. Cl.[7] ..................... H01L 23/043; H01L 23/495; H01L 21/44; H01L 21/48; H01L 21/50
(52) U.S. Cl. ...................... 257/708; 257/666; 438/111; 438/123; 29/827
(58) Field of Search ................. 257/667, 678, 257/666, 708; 438/111, 123; 29/827

(56) References Cited

U.S. PATENT DOCUMENTS

| | | | |
|---|---|---|---|
| 4,530,152 A | 7/1985 | Roche et al. ................. | 29/588 |
| 5,041,902 A | 8/1991 | McShane .................... | 357/79 |
| 5,157,480 A | 10/1992 | McShane et al. ............. | 357/74 |
| 5,172,213 A | 12/1992 | Zimmerman ................ | 257/796 |
| 5,172,214 A | 12/1992 | Casto ......................... | 257/676 |
| 5,278,446 A | 1/1994 | Nagaraj et al. ............. | 257/707 |
| 5,428,248 A | 6/1995 | Cha ............................ | 257/676 |
| 5,521,429 A | 5/1996 | Aono et al. .................. | 257/676 |
| 5,701,034 A | 12/1997 | Marrs ......................... | 257/706 |
| 5,783,861 A | 7/1998 | Son ............................ | 253/693 |
| 5,814,877 A * | 9/1998 | Diffenderfer et al. ....... | 257/666 |
| 5,835,988 A | 11/1998 | Ishii ............................ | 257/684 |
| 5,866,939 A | 2/1999 | Shin et al. .................. | 257/666 |
| 5,894,108 A | 4/1999 | Mostafazadeh et al. .... | 174/25.4 |
| 5,977,613 A | 11/1999 | Takata et al. ............... | 257/666 |
| 5,977,630 A | 11/1999 | Woodworth et al. ........ | 257/712 |
| 6,081,029 A * | 6/2000 | Yamaguchi ................. | 257/718 |
| 6,143,981 A | 11/2000 | Glenn ........................ | 174/52.4 |
| 6,177,718 B1 * | 1/2001 | Kozono ...................... | 257/666 |
| 6,229,200 B1 | 5/2001 | Mclellan et al. ............ | 257/666 |
| 6,242,281 B1 | 6/2001 | Mclellan et al. ............ | 438/106 |
| 6,294,100 B1 | 9/2001 | Fan et al. .................... | 216/14 |
| 6,355,502 B1 | 3/2002 | Kang et al. ................. | 438/110 |

FOREIGN PATENT DOCUMENTS

| | | |
|---|---|---|
| JP | 57-45959 | 3/1982 |
| JP | 58-101317 | 6/1983 |
| JP | 58-160095 | 9/1983 |

(List continued on next page.)

*Primary Examiner*—Carl Whitehead, Jr.
*Assistant Examiner*—Nema Berezny
(74) *Attorney, Agent, or Firm*—Stetina Brunda Garred & Brucker

(57) ABSTRACT

A semiconductor package which is improved in thinness and heat radiation and a method for making the same. The package includes a semiconductor chip electrically connected to leads of a leadframe via input and output bond pads. The leadframe may have a ground ring formed therein. The leads and semiconductor chip are at least partially encapsulated by an encapsulant. The semiconductor chip and leads have bottom surfaces which are externally exposed to improve heat radiation and reduce the thickness of the package. The package is made by placing the leadframe having leads onto adhesive tape, affixing a semiconductor chip into an open space on the leadframe, pressurizing the leadframe and chip downwardly for securement to the adhesive tape, electrically connecting input bond pads and output bond pads on the chip to the leads; at least partially encapsulating the leads and semiconductor chip; removing the tape from the bottom surfaces of the leads and chip; and cutting the leadframe to form the package. In an alternate embodiment, a chip paddle is connected to the leadframe and the semiconductor chip is secured to the chip paddle via an adhesive.

12 Claims, 7 Drawing Sheets

FOREIGN PATENT DOCUMENTS

| | | |
|---|---|---|
| JP | 61-39555 | 2/1986 |
| JP | 62-9639 | 1/1987 |
| JP | 63-205935 | 8/1988 |
| JP | 63-233555 | 9/1988 |
| JP | 64-54749 | 3/1989 |
| JP | 07-312405 | 11/1995 |
| JP | 08-125066 | 5/1996 |
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| KR | 92-10286 A | 6/1992 |
| KR | 92-10286 B | 11/1992 |
| KR | 96-9774 A | 3/1996 |
| KR | 96-9774 B | 7/1996 |

* cited by examiner

THIN AND HEAT RADIANT SEMICONDUCTOR PACKAGE AND METHOD FOR MANUFACTURING

BACKGROUND OF THE INVENTION

1. Technical Field of the Invention

The present invention relates to a packaged semiconductor, a semiconductor package and a method for fabricating the package, and more particularly but not by way of limitation, to a thin semiconductor package having improvements in heat radiation and a method for manufacturing the same.

2. History of Related Art

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal lead frames for supporting an integrated circuit chip which is bonded to a chip paddle region formed centrally therein. Bond wires which electrically connect pads on the integrated circuit chip to individual leads of the lead frame are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a lead frame as the central supporting structure of such a package. A portion of the lead frame completely surrounded by the plastic encapsulant is internal to the package. Portions of the lead frame extend internally from the package and are then used to connect the package externally. More information relative to lead frame technology may be found in Chapter 8 of the book *Micro Electronics Packaging Handbook*, (1989), edited by R. Tummala and E. Rymaszewski and incorporated by reference herein. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a motherboard on which a significant number of such semiconductor packages are secured to provide multiple electronic functions. These electronic appliances are typically manufactured in reduced sizes and at reduced costs, consumer demand increases. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to motherboards and support the semiconductor chips on the motherboards, have been designed to have a small size. By way of example only, such semiconductor packages may have a size on the order of 1×1 mm to 10×10 mm. Examples of such semiconductor packages are referred to as MLF (micro leadframe) type semiconductor packages and MLP (micro leadframe package) type semiconductor packages. Both MLF type semiconductor packages and MLP type semiconductor packages are generally manufactured in the same manner.

Such conventional semiconductor packages are not without problems. Specifically, a typical semiconductor package is difficult to make slim because the thickness of the internal leads is equivalent to the thickness of the chip paddle. Further, the mounting of the semiconductor chip on the chip paddle increases the overall thickness of the package. The thickness is increased because of the input/output pads on the semiconductor chip mounted on the chip paddle are positioned at a higher level than the internal leads, thereby increasing the loop height of the conductive wires. The increased height may contribute to wire sweeping, caused by the encapsulation material during encapsulation.

In addition, mounting the semiconductor chip on a chip paddle having an externally exposed bottom surface has poorer heat radiation than having a direct externally exposed bottom surface of the semiconductor chip.

Finally, after the chip-mounting step and wire-bonding step are performed, the semiconductor package is encapsulated only after the leadframe is positioned on a mold. Thus, although the leadframe is in close contact with the lower mold die, some encapsulation material infiltrates through the interface between the leadframe and the lower mold die, resulting in the formation of so-called "flash". An extra de-flashing step must then generally be executed.

SUMMARY OF THE INVENTION

In one embodiment of the present invention, there is provided a semiconductor package comprising a semiconductor chip having an upper surface and a bottom surface. A plurality of input bond pads and output bond pads on the upper surface of the semiconductor chip and along the circumference of the semiconductor chip are electrically connected to the semiconductor chip. A chip paddle may be provided which has a top surface, a side surface and a bottom surface. The chip paddle is bonded to the bottom surface of the semiconductor chip by an adhesive. The chip paddle has corners, a circumference and a half-etched section at the lower edge of the chip paddle along the chip paddle circumference.

A lead frame is provided having a plurality of tie bars. Each of the tie bars has a side surface and a bottom surface. The plurality of tie bars are connected to the corners of the chip paddle. The plurality of the tie bars externally extend from the chip paddle and have a half-etched section. A plurality of dam bars are provided on the lead frame help limit flow of encapsulation material on the leadframe.

A plurality of internal leads connect to the leadframe. Each of the leads has a side surface and a bottom surface. The leads are radially formed at regular intervals along and spaced apart from the circumference to the chip paddle and extend towards the chip paddle. Each of the leads has a step shaped half-etched section facing the chip paddle.

A plurality of via conductive wires are electrically connected to and between the plurality of leads and the semiconductor chip. Encapsulating material encapsulates the semiconductor chip, conductive wires, chip paddle, and the leads to form a package body. The flow of the encapsulation material is limited by the dam bars formed on the leadframe. The dam bars also serve to stabilize the leads on the leadframe. After encapsulation, the chip paddle, leads, and tie bars are externally exposed at respective side and bottom surfaces.

A ground ring may be provided on the leadframe having an upper surface and a lower surface. The conductive wires may be connected to the ground ring, which is exposed at the lower surface. The ground ring may further serve to function as a power ring.

BRIEF DESCRIPTION OF THE DRAWINGS

A more complete understanding of the method and apparatus of the present invention may be obtained by reference to the following detailed description when taken in conjunction with the accompanying Drawings wherein.

DETAILED DESCRIPTION OF THE PREFERRED EMBODIMENTS

Figure 1A:
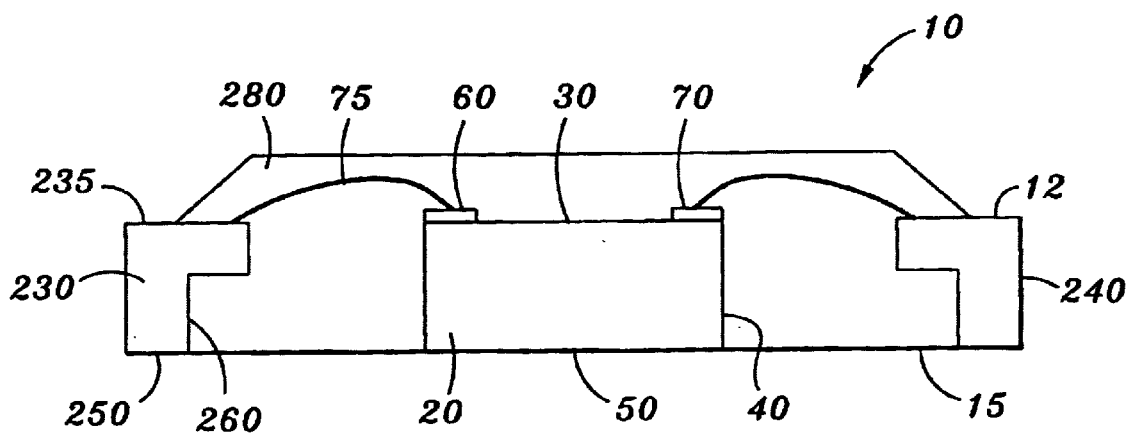
FIG. 1A is a cross-section of a semiconductor package made in accordance with one embodiment of the present invention.
Figure 1B:
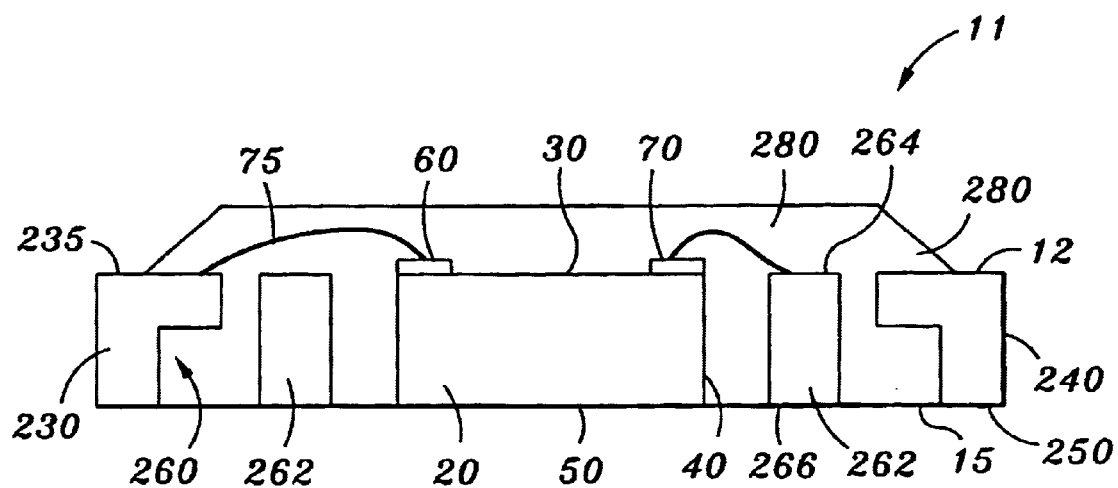
FIG. 1B is a cross-section of the semiconductor package of FIG. 1A with a ground ring included in the package.

Referring first to FIGS. 1A and 1B, there is shown a cross sectional illustration of one embodiment of a semiconductor package 10 construed in accordance with the principles of the present invention. The semiconductor package 10 includes a corner 12 and bottom surface 15. The semiconductor package 10 further includes a semiconductor chip 20 having an upper surface 30, a circumference 40 and a bottom surface 50. A plurality of input bond pads 60 and output bond pads 70 are disposed on the upper surface 30 of the semiconductor chip 20. Conductive wires 75, including but not limited to gold or aluminum wires, electrically connect the semiconductor chip 20 to the respective input bond pads 60 or output bond pads 70.

Figure 2A:
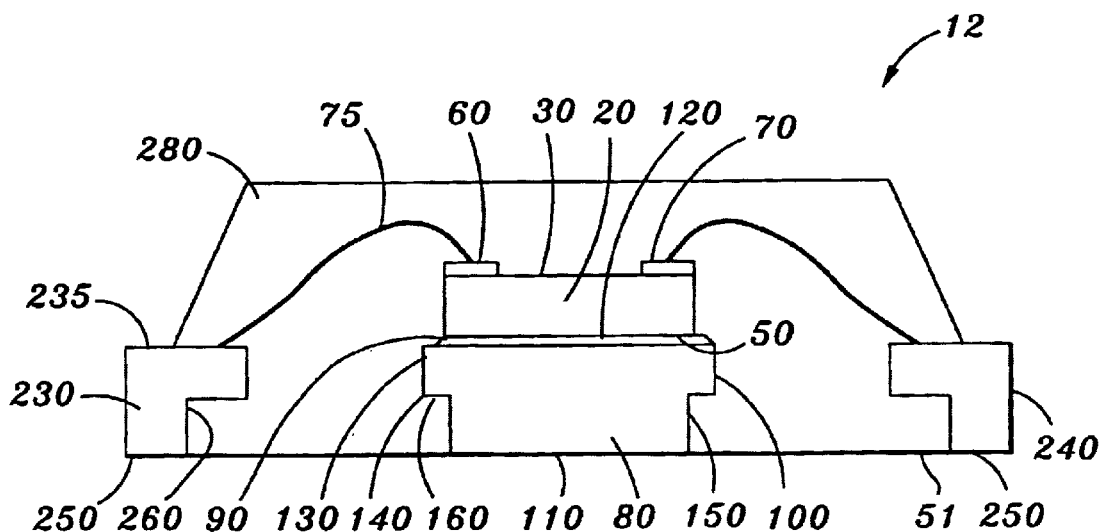
FIG. 2A is a cross-section of an alternate embodiment of a semiconductor package made in accordance with the teachings of the present invention.
Figure 2B:
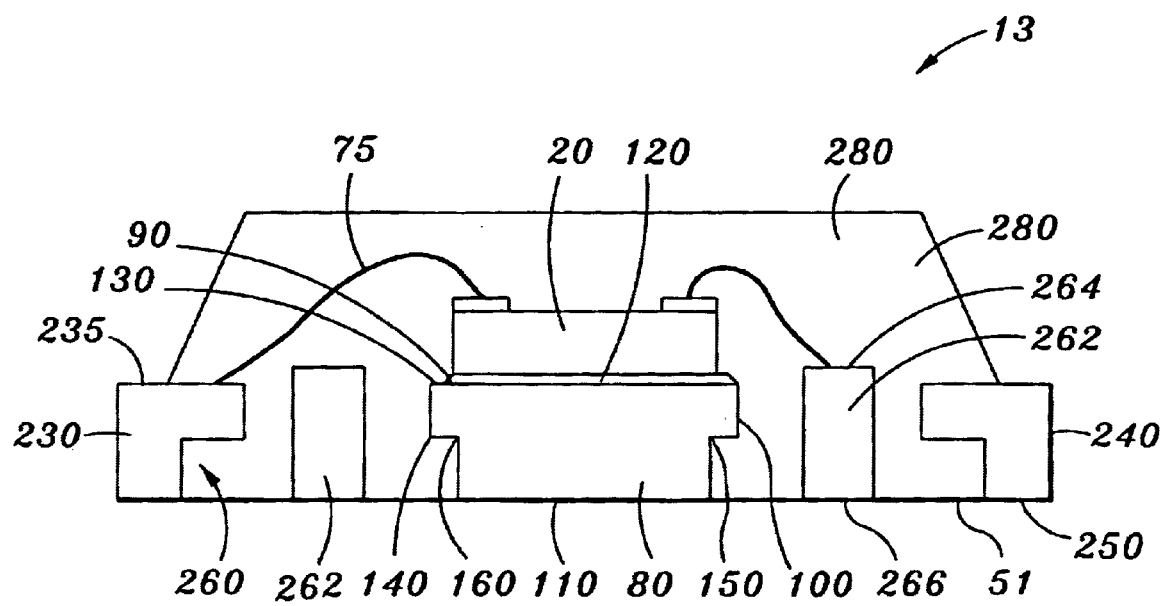
FIG. 2B is a cross-section of the semiconductor package of FIG. 2A with a ground ring included in the package.

In an alternate embodiment best seen in FIGS. 2A and 2B, a chip paddle 80 having a upper surface 90, a side surface 100 and a bottom surface 110 is secured to the bottom surface 50 of the semiconductor chip 20 via an adhesive 120. The chip paddle 80 has corners 130, a circumference 140 and may include a half-etched section 150. The half-etched section 150 is located at a lower edge 160 of the chip paddle 80.

Figure 3:
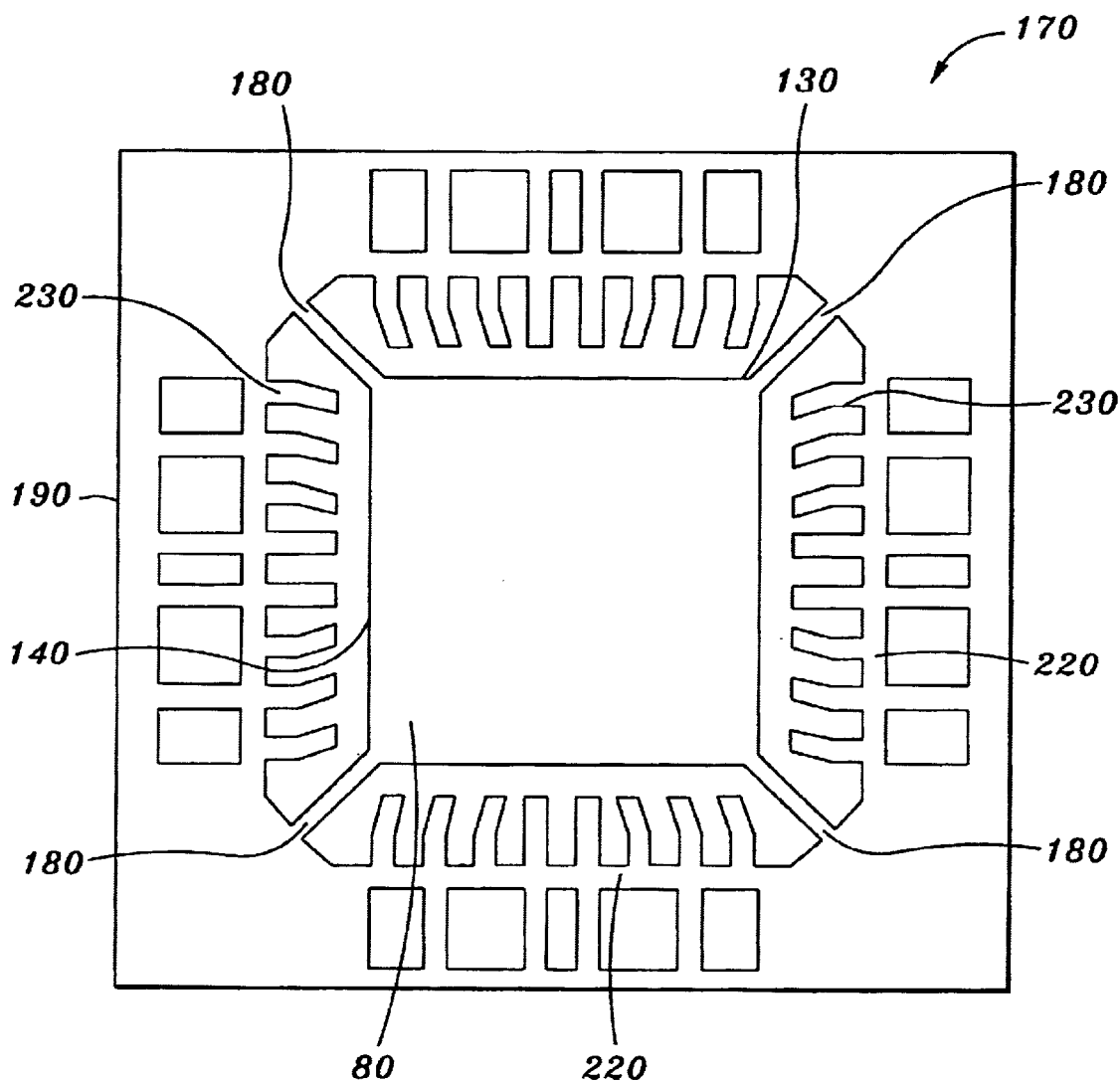
FIG. 3 is a top plan view of a leadframe.
Figure 4:
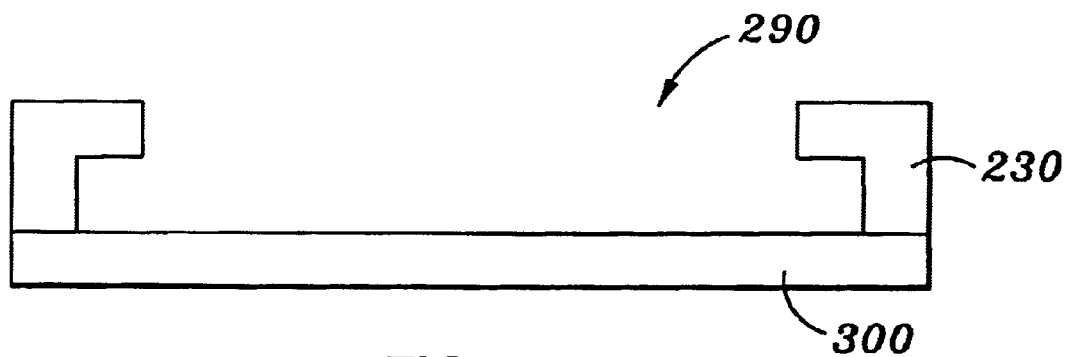
FIGS. 4–9 are side-elevation cross-sections of a preferred embodiment of the semiconductor package of the present invention from the initial to final construction.

Referring now to FIG. 3, a leadframe 170 is shown having a plurality of tie bars 180 and a side surface 190. The tie bars 180 are connected to the corners 130 of the chip paddle 80 and externally extend from the chip paddle 80. The leadframe 170 also includes a plurality of dam bars 220.

A plurality of leads 230 are connected to the leadframe 170 and have an upper surface 235, a side surface 240 and a bottom surface 250. In a first embodiment seen in FIGS. 1A and 1B, the leads 230 are radially formed at regular intervals along the semiconductor chip circumference 40 and spaced apart from the circumference 40 of the semiconductor chip 20. The leads 230 extend towards the chip 20 and have a half-etched section 260 facing the chip 20.

In an alternate embodiment best seen in FIGS. 2A and 2B, the leads 230 are radially formed at regular intervals along the chip paddle circumference 140 and spaced apart from the circumference 140 of the chip paddle 80. The leads 230 extend towards the chip paddle 80, such that each of the plurality of leads 230 has a half-etched section 260 facing the chip paddle 80.

Referring back to FIGS. 1B and 2B, there is shown a ground ring 262 formed in package 10. The ground ring 262 is positioned between the semiconductor chip 20 and the plurality of leads 230, and may be interchangeably used as a power ring should circumstances require. Conductive wires 75 can connect the ground ring 262 to the respective input bond pads 60 or output bond pads 70, depending on the application. As seen in FIG. 1B, the upper surface 264 of the ground ring 262 is planar with the upper surface 30 of the semiconductor chip 20 and the upper surface 235 of the leads 230. However, as seen in FIG. 2B, the upper surface 264 of the ground ring 262 may be planar with the upper surface of the chip paddle 80 to minimize package thickness. Likewise, the upper surface 235 of the leads 230 is planar with the upper surface 30 of the semiconductor chip 20 (FIGS. 1A and 1B) to minimize package thickness. In the alternate embodiments shown in FIGS. 2A and 2B, the upper surface 235 of the leads 230 is planar with the upper surface 90 of the chip paddle 80 to reduce package thickness.

Referring generally now to FIGS. 1A and 3, to enclose the semiconductor package 10, encapsulation material 280 at least partially encapsulates the semiconductor chip 20, conductive wires 70, and leads 230. In the alternate embodiment shown in FIG. 2A and 2B, the encapsulation material 280 encapsulates the chip paddle 80 as well. Likewise, for the embodiments shown in FIGS. 1B and 2B, the encapsulation material 280 encapsulates the ground ring 262.

Referring now to FIGS. 1 through 3 in general, dam bars 220 limit the flow of the encapsulation material 280 on the leadframe 170 and provide stability to the leads 230 on the leadframe 170. In the respective embodiment during encapsulation, the chip paddle 80, leads 230, and tie bars 180 may be externally exposed at peripheral side and bottom surfaces. The externally exposed portions of chip paddle 80, leads 230, and tie bars 180 may, but do no necessarily have to be, electroplated with corrosion-minimizing materials such as but not limited to, tin lead, tin, gold, nickel palladium, tin bismuth, or any other similar material known in the art. The respective half-etched sections 150, 260 of the chip paddle 80 and leads 230 are provided to increase the bonding strength of the encapsulation material 280 in the package 10. It is contemplated that the respective half-etched sections 150, 260 may be eliminated without departing from the scope and spirit of this invention.

Figure 5:
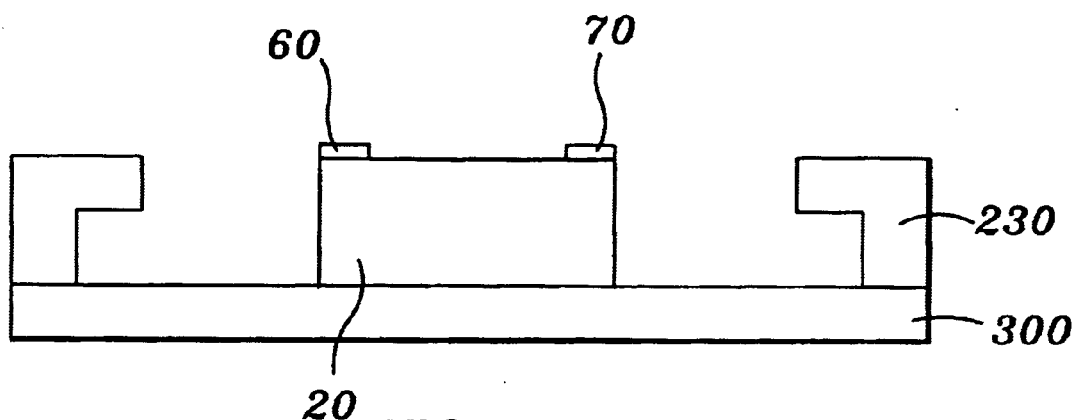

Referring now to FIGS. 4–9 in general, there is shown a cross-section of the semiconductor package 10 of FIG. 1A. It is to be recognized that the method for constructing the semiconductor package 10 of FIG. 1A may be used for constructing the embodiment shown in FIG. 1B without departing from the principles of this invention. The leadframe, although not shown in these figures, having leads 230 and a space 290 large enough to accommodate a semiconductor chip 20, is first placed upon an adhesive tape 300. Next, a semiconductor chip 20 is fixed to the adhesive tape 300 within the space 290 as best seen in FIG. 5. The semiconductor chip 20 and the leads 230 are pressurized downwardly onto the tape 300 at a suitable temperature to make the tape 300 firmly adhere to the semiconductor chip 20 and leads 230.

Figure 6:
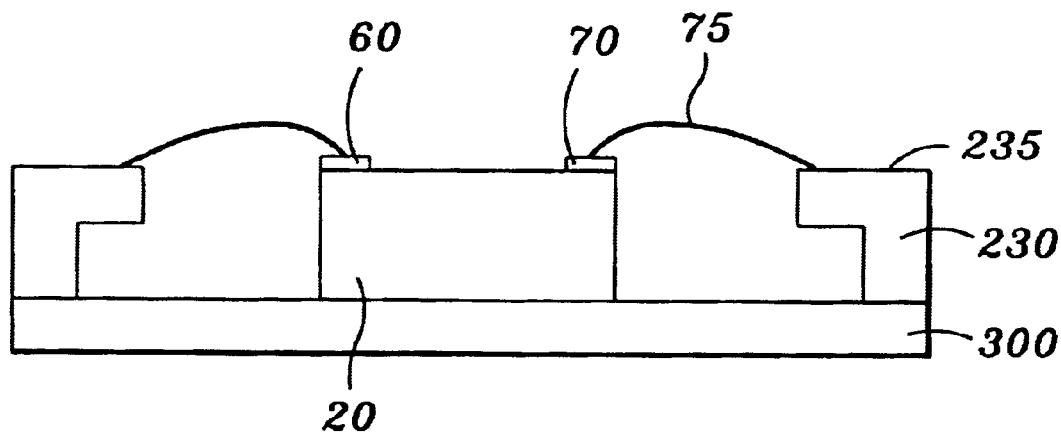

As shown in FIG. 6, the input bond pads 60 and output bond pads 70 of the semiconductor chip 20 are next electrically connected to the leads 230 via conductive wires 75. Upper surface 235 of leads 230 may, but do not necessarily have to be, electroplated with a material that enhances electrical conductivity such as, for example, gold or silver. Typically, the conductive wires 75 are connected via an automated process, but may be connected in any alternate method in the industry.

Figure 7:
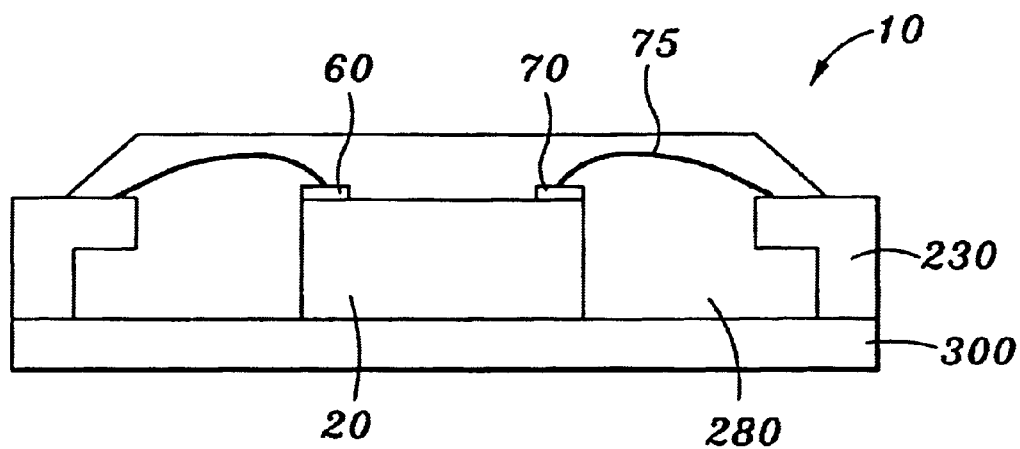
Figure 8:
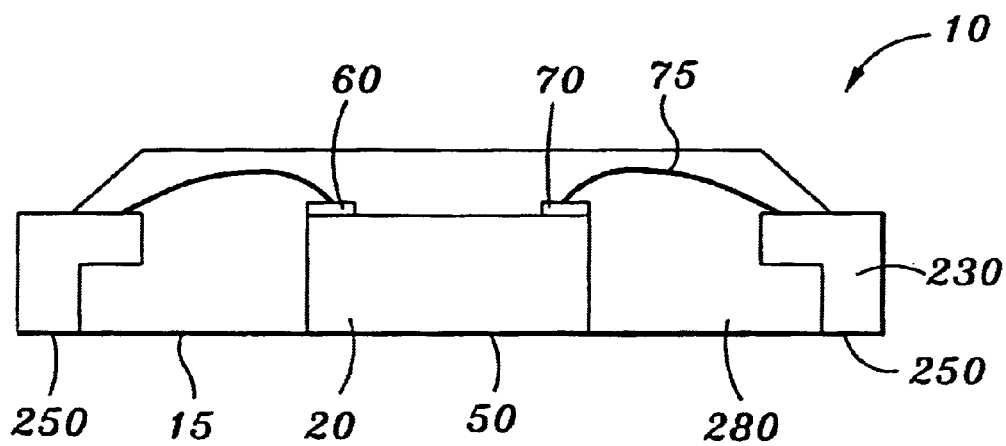
Figure 9:
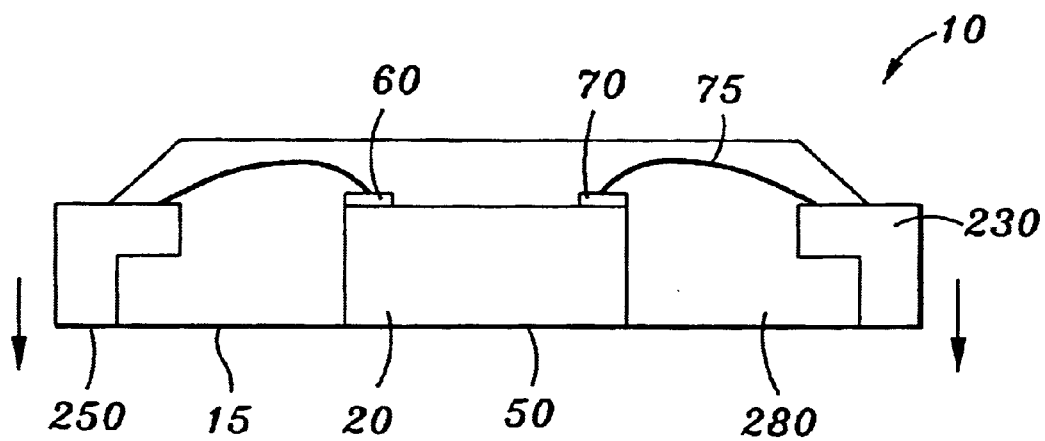
Figure 10:
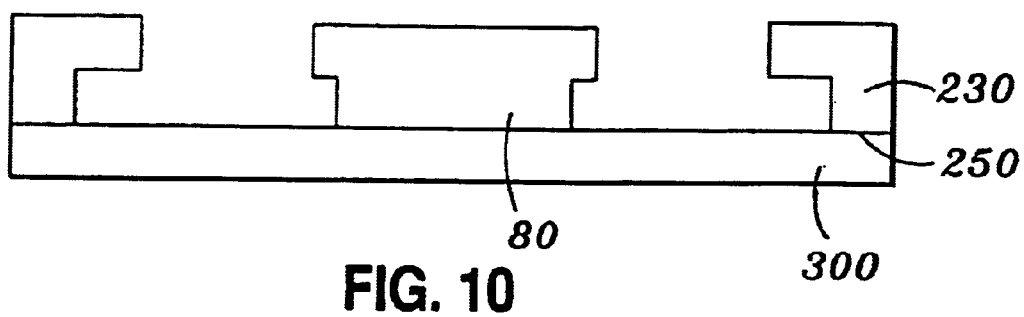
FIGS. 10–14 are side-elevation cross-sections of an alternate embodiment of the semiconductor package of the present invention from the initial to final construction.

The semiconductor chip 20, conductive wires 75, and leads 230 are then at least partially encapsulated with the encapsulation material 280, which may be an epoxy molding compound or a liquid encapsulation material, thereby forming a package body 10 as seen in FIG. 7. Referring to FIG. 8, the adhesive tape 300 is next removed from the bottom surface 15 of the package 10. The leads 230 are next severed from the leadframe (not shown) by cutting through the dam bars (not shown) or neighboring areas of the package body 10 best seen in FIG. 9 as a singulation step. It is to be noted that this singulation step may occur before the adhesive tape 300 is removed.

After formation of the package body 10, a marking process (not shown) may be carried out by the use of ink or lasers. The removal of the adhesive tape 300 allows the semiconductor chip 20 and leads 240 to be exposed to the outside, thereby improving heat radiation. By adhering the adhesive tape 250 to the bottom surfaces 15, 250 of the semiconductor chip 20 and leads 230, respectively, flashes, which are typically formed during the molding process are not generated, thereby eliminating or reducing any further deflashing steps.

After the removal of the adhesive tape 300, a predetermined thickness of solder (not shown) may be plated over the bottom surface 250 of the of the leads 230 to allow easy fusion of the package 10 to a motherboard (not shown).

Referring now generally to FIGS. 10–14, there are shown cross-sections of the semiconductor package 10 of FIG. 2A during various stages of construction. It is to be recognized that the method for constructing the semiconductor package 10 of FIG. 2A may be used for constructing the embodiment shown in FIG. 2B without departing from the principles of this invention. The leadframe (not shown) having leads 230 and a chip paddle 80 is first placed upon an adhesive tape 300 best seen in FIG. 10. The chip paddle 80 and the leads 230 are pressurized downwardly onto the tape 300 at a suitable temperature to make the tape 300 firmly adhere to the chip paddle 80 and leads 230.

Figure 11:
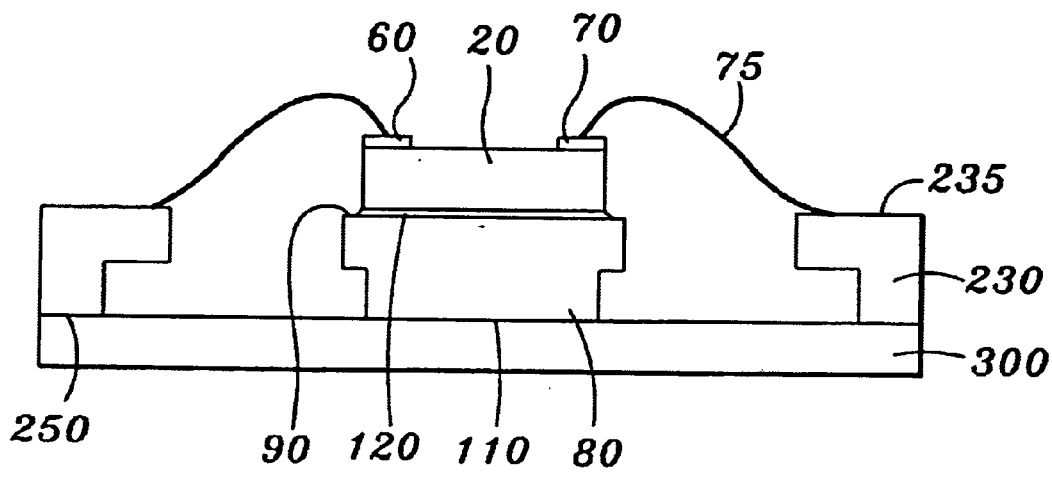

As shown in FIG. 11, the semiconductor chip 20 is bonded to the upper surface 90 of the chip paddle 80 via an adhesive 120. The input pads 60 and output pads 70 of the semiconductor chip 20 are next electrically connected to the leads 230 via conductive wires 75. Upper surfaces 235 of leads 230 may, but do not necessarily have to be, electroplated with a material that enhances electrical conductivity such as, for example, gold or silver. Typically, the conductive wires 75 are connected via an automated process, but may also be connected in any alternate method in the industry.

Figure 12:
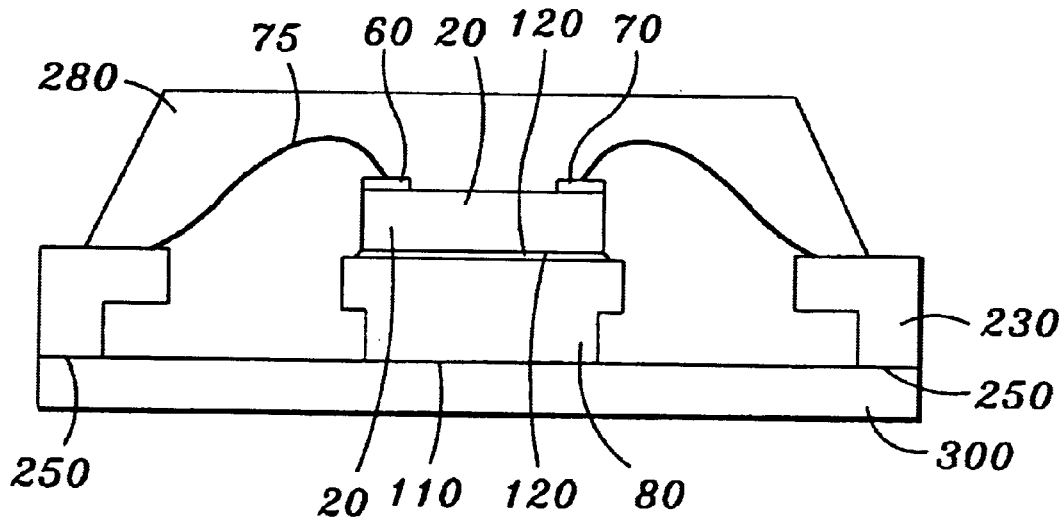

The semiconductor chip 20, chip paddle 80, conductive wires 75, and leads 230 are then at least partially encapsulated with the encapsulation material 280, which may be thermoplastics or thermoset resins, with thermoset resins including, for example, silicones, phenolics, and epoxies. The encapsulation material 280 forms a package body 10 as seen in FIG. 12.

Figure 13:
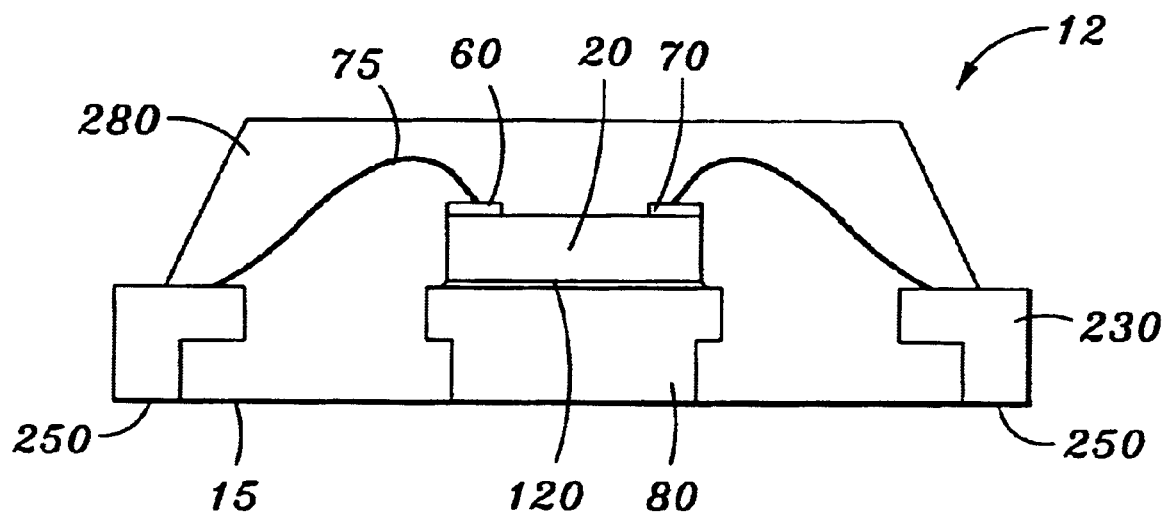
Figure 14:
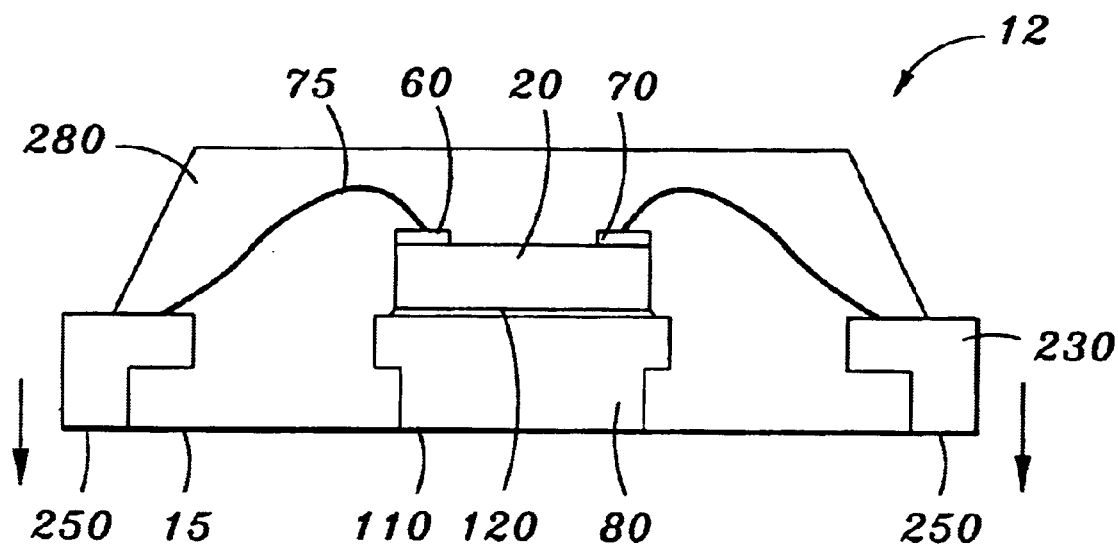

Referring to FIG. 13, the adhesive tape 300 is next removed from the bottom surface 15 of the package 10. The leads 230 are next severed from the leadframe (not shown) by cutting through the dam bars (not shown) or neighboring areas of the package body 10 best seen in FIG. 14 in a singulation step. It is noted that this singulation step may occur before the adhesive tape 300 is removed.

Once the package body 10 is formed, a marking process (not shown) may be carried out by the use of ink or lasers. The removal of the adhesive tape 300 allows the chip paddle 80 and leads 230 to be exposed to the outside, thereby improving heat radiation. By adhering the adhesive tape 300 to the bottom surfaces 110, 250 of the chip paddle 80 and leads 230, respectively, flashes, which are typically formed during the molding process, are not generated, thereby eliminating or reducing any further deflashing steps. Bottom surfaces 110, 250 of the chip paddle 80 and leads 230, may be electroplated with corrosion-minimizing materials such as, but not limited to, tin lead, tin, gold, nickel palladium, tin bismuth, or other similar materials known in the art.

After the removal of the tape 300, a predetermined thickness of solder (not shown) may be plated over the bottom surface 250 of the of the leads 230 to allow easy fusion of the package 10 to a motherboard (not shown).

In such a semiconductor package as described and shown in FIGS. 1A and 1B, the bottom surface 15 of the semiconductor chip 20 is in the same plane as the bottom surface 250 of the leads 230, so that the semiconductor package 10 is thin by limiting the height level of the conductive wires 75. In addition, the direct exposure of the semiconductor chip 20 provides for higher thermal radiation.

The following applications are all being filed on the same date as the present application and all are incorporated by reference as if wholly rewritten entirely herein:

| Attorney Docket No. | Title of Application | First Named Inventor |
| --- | --- | --- |
| 45475-00014 | Lead Frame for Semiconductor Package and Mold for Molding the Same | Young Suk Chung |
| 45475-00017 | Method for Making a Semiconductor Package Having Improved Defect Testing and Increased Production Yield | Tae Heon Lee |
| 45475-00018 | Near Chip Size Semiconductor Package | Sean Timothy Crowley |
| 45475-00022 | End Grind Array Semiconductor Package | Jae Hun Ku |
| 45475-00026 | Leadframe and Semiconductor Package with Improved Solder Joint Strength | Tae Heon Lee |
| 45475-00027 | Semiconductor Package Having Reduced Thickness | Tae Heon Lee |
| 45475-00029 | Semiconductor Package Leadframe Assembly and Method of Manufacture | Young Suk Chung |
| 45475-00030 | Semiconductor Package and Method Thereof | Young Suk Chung |

It is thus believed that the operation and construction of the present invention will be apparent from the foregoing description of the preferred exemplary embodiments. It will be obvious to a person of ordinary skill in the art that various changes and modifications may be made herein without departing from the spirit and the scope of the invention.

What is claimed is:

1. A packaged semiconductor, comprising:
   a semiconductor chip having a planar upper surface, a perimeter and a bottom surface;
   a plurality of input bond pads on the planar upper surface of the semiconductor chip along the perimeter and electrically connected to said semiconductor chip;

a plurality of output bond pads on the planar upper surface along the perimeter of said semiconductor chip and electrically connected to said semiconductor chip;

a leadframe having a plurality of tie bars, which each have a side surface and a bottom surface, and a ground ring having a bottom surface;

a plurality of leads connected to said leadframe, each of said plurality of leads having a side surface, an upper surface, and a bottom surface, said plurality of leads being spaced apart from said perimeter of said semiconductor chip and extending towards said semiconductor chip, each of said leads further having a half-etched section facing said semiconductor chip;

a plurality of conductive wires electrically connecting said plurality of leads to said semiconductor chip;

encapsulant material encapsulating said semiconductor chip, said plurality of conductive wires, and said plurality of leads to form a package body;

a chip paddle connected to said leadframe, said chip paddle having a top surface, a side surface and a bottom surface, said chip paddle being bonded to said bottom surface of said semiconductor chip by an adhesive, said chip paddle further having corners, a perimeter and a half-etched section at a lower edge of said chip paddle along said chip paddle perimeter;

wherein said upper surfaces of said plurality of leads and said top surface of said chip paddle are substantially co-planar, and said bottom surfaces of said leads, said ground ring and said chip paddle are exposed within said package body.

2. The packaged semiconductor of claim 1, wherein each of said plurality of tie bars has a half-etched section, and is connected to said chip paddle perimeter at a respective one of said corners of said chip paddle.

3. The packaged semiconductor of claim 1, wherein each of said plurality of tie bars is connected to said chip paddle perimeter at a respective one of said corners of said chip paddle.

4. The packaged semiconductor of claim 1, wherein each of said plurality of tie bars has a half-etched section.

5. The packaged semiconductor of claim 1, wherein said ground ring is positioned between said plurality of leads and said semiconductor chip.

6. A packaged semiconductor, comprising:

a leadframe having a plurality of tie bars, each of said tie bars having a side surface and a bottom surface, said leadframe further having a space for receiving a semiconductor chip;

a semiconductor chip having a planar upper surface, a perimeter and a bottom surface secured into said space defined by said leadframe;

a plurality of leads connected to said leadframe, each of said plurality of leads having a side surface, an upper surface, and a bottom surface, each of said plurality of leads further having a half-etched section facing said semiconductor chip;

a plurality of conductive wires electrically connecting said plurality of leads to said semiconductor chip;

encapsulant material encapsulating said semiconductor chip, said plurality of conductive wires, and said plurality of leads to form a package body;

a ground ring having a top surface and a bottom surface, said ground ring being disposed between said plurality of leads and said semiconductor chip;

wherein said bottom surfaces of said semiconductor chip and said plurality of leads are exposed within said package body, and said top surface of said ground ring and said upper surfaces of said plurality of leads are substantially co-planar.

7. The packaged semiconductor of claim 6, further comprising:

a chip paddle connected to said leadframe, said chip paddle having a top surface, a side surface and a bottom surface, said chip paddle being bonded to said bottom surface of said semiconductor chip by an adhesive, said chip paddle having corners, a perimeter and a half-etched section at a lower edge of said chip paddle along said chip paddle perimeter, wherein said bottom surface of said chip paddle is exposed within said package body, and wherein said top surface of said ground ring, said upper surfaces of said plurality of leads and said top surface of said chip paddle are substantially co-planar.

8. A packaged semiconductor, comprising:

a semiconductor chip having a planar upper surface, a perimeter and a bottom surface;

a plurality of input bond pads on the planar upper surface of the semiconductor chip along the perimeter and electrically connected to said semiconductor chip;

a plurality of output bond pads on the planar upper surface along the perimeter of said semiconductor chip and electrically connected to said semiconductor chip;

a leadframe having a plurality of tie bars which each have a side surface and a bottom surface, and a ground ring having an upper surface and a bottom surface;

a plurality of leads connected to said leadframe, each of said plurality of leads having a side surface, an upper surface, and a bottom surface, said plurality of leads being spaced apart from said perimeter of said semiconductor chip and extending toward said semiconductor chip, each of said leads further having a half-etched section facing said semiconductor chip;

a plurality of conductive wires electrically connecting said plurality of leads to said semiconductor chip;

encapsulant material encapsulating said semiconductor chip, said plurality of conductive wires, and said plurality of leads to form a package body;

a chip paddle connected to said leadframe, said chip paddle having a top surface, a side surface and a bottom surface, said chip paddle being bonded to said bottom surface of said semiconductor chip by an adhesive, said chip paddle further having corners, a perimeter and a half-etched section at a lower edge of said chip paddle along said chip paddle perimeter;

wherein said upper surfaces of said plurality of leads, said upper surface of said ground ring, and said top surface of said chip paddle are substantially co-planar, and said bottom surfaces of said leads and said bottom surface of said chip paddle are exposed within said package body.

9. A packaged semiconductor, comprising:

a semiconductor chip having a planar upper surface, a perimeter and a bottom surface;

a plurality of input bond pads on the planar upper surface of the semiconductor chip along the perimeter and electrically connected to said semiconductor chip;

a plurality of output bond pads on the planar upper surface along the perimeter of said semiconductor chip and electrically connected to said semiconductor chip;

a leadframe having a plurality of tie bars which each have a side surface and a bottom surface, and a ground ring having a bottom surface, said ground ring functioning as a power ring and being electrically connected to said semiconductor chip;

a plurality of leads connected to said leadframe, each of said plurality of leads having a side surface, an upper surface, and a bottom surface, said plurality of leads being spaced apart from said perimeter of said semiconductor chip and extending towards said semiconductor chip, each of said leads further having a half-etched section facing said semiconductor chip;

a plurality of conductive wires electrically connecting said plurality of leads to said semiconductor chip;

encapsulant material encapsulating said semiconductor chip, said plurality of conductive wires, and said plurality of leads to form a package body;

a chip paddle connected to said leadframe, said chip paddle having a top surface, a side surface and a bottom surface, said chip paddle being bonded to said bottom surface of said semiconductor chip by an adhesive, said chip paddle further having a perimeter and a half-etched section at a lower edge of said chip paddle along said chip paddle perimeter;

wherein said upper surfaces of said plurality of leads and said top surface of said chip paddle are substantially co-planar, and said bottom surfaces of said leads and said bottom surface of said chip paddle are exposed within said package body.

10. A packaged semiconductor, comprising:

a semiconductor chip having a planar upper surface, a perimeter and a bottom surface;

a plurality of input bond pads on the planar upper surface of the semiconductor chip along the perimeter and electrically connected to said semiconductor chip;

a plurality of output bond pads on the planar upper surface along the perimeter of said semiconductor chip and electrically connected to said semiconductor chip;

a leadframe having a plurality of tie bars which each have a side surface and a bottom surface, and a ground ring having a bottom surface;

a plurality of leads connected to said leadframe, each of said plurality of leads having a side surface, an upper surface, and a bottom surface, said plurality of leads being spaced apart from said perimeter of said semiconductor chip and extending towards said semiconductor chip, each of said leads further having a half-etched section facing said semiconductor chip;

a plurality of conductive wires electrically connecting said plurality of leads to said semiconductor chip;

encapsulant material encapsulating said semiconductor chip, said plurality of conductive wires, and said plurality of leads to form a package body;

a chip paddle connected to said leadframe, said chip paddle having a top surface, a side surface and a bottom surface, said chip paddle being bonded to said bottom surface of said semiconductor chip by an adhesive, said chip paddle further having corners, a perimeter and a half-etched section at a lower edge of said chip paddle along said chip paddle perimeter;

wherein said bottom surfaces of said leads, said bottom surface of said ground ring and said bottom surface of said chip paddle are exposed within said package body.

11. A packaged semiconductor, comprising:

a semiconductor chip having a planar upper surface, a perimeter and a bottom surface;

a plurality of input bond pads on the planar upper surface of the semiconductor chip along the perimeter and electrically connected to said semiconductor chip;

a plurality of output bond pads on the planar upper surface along the perimeter of said semiconductor chip and electrically connected to said semiconductor chip;

a leadframe having a plurality of tie bars which each have a side surface and a bottom surface, and a ground ring having an upper surface and a bottom surface;

a plurality of leads connected to said leadframe, each of said plurality of leads having a side surface, an upper surface, and a bottom surface, said plurality of leads being spaced apart from said perimeter of said semiconductor chip and extending toward said semiconductor chip, each of said leads further having a half-etched section facing said semiconductor chip;

a plurality of conductive wires electrically connecting said plurality of leads to said semiconductor chip;

encapsulant material encapsulating said semiconductor chip, said plurality of conductive wires, and said plurality of leads to form a package body;

a chip paddle connected to said leadframe, said chip paddle having a top surface, a side surface and a bottom surface, said chip paddle being bonded to said bottom surface of said semiconductor chip by an adhesive, said chip paddle further having corners, a perimeter and a half-etched section at a lower edge of said chip paddle along said chip paddle perimeter;

wherein said upper surface of said ground ring and said top surface of said chip paddle are substantially co-planar, and the bottom surfaces of said leads are exposed within said package body.

12. A packaged semiconductor, comprising:

a semiconductor chip having a planar upper surface, a perimeter and a bottom surface;

a plurality of input bond pads on the planar upper surface of the semiconductor chip along the perimeter and electrically connected to said semiconductor chip;

a plurality of output bond pads on the planar upper surface along the perimeter of said semiconductor chip and electrically connected to said semiconductor chip;

a leadframe having a plurality of tie bars which each have a side surface and a bottom surface, and a ground ring having a bottom surface, said ground ring functioning as a power ring and being electrically connected to said semiconductor chip;

a plurality of leads connected to said leadframe, each of said plurality of leads having a side surface, an upper surface, and a bottom surface, said plurality of leads being spaced apart from said perimeter of said semiconductor chip and extending towards said semiconductor chip, each of said leads further having a half-etched section facing said semiconductor chip;

a plurality of conductive wires electrically connecting said plurality of leads to said semiconductor chip;

encapsulant material encapsulating said semiconductor chip, said plurality of conductive wires, and said plurality of leads to form a package body;

a chip paddle connected to said leadframe, said chip paddle having a top surface, a side surface and a bottom surface, said chip paddle being bonded to said bottom surface of said semiconductor chip by an adhesive, said chip paddle further having corners, a perimeter and a half-etched section at a lower edge of said chip paddle along said chip paddle perimeter;

wherein said bottom surfaces of said leads are exposed within said package body.

* * * * *